(12) United States Patent
DeMar

(10) Patent No.: US 9,167,317 B2
(45) Date of Patent: Oct. 20, 2015

(54) BATTERY MONITORING SYSTEM

(76) Inventor: Edward DeMar, Oswego, NY (US)

( * ) Notice: Subject to any disclaimer, the term of this patent is extended or adjusted under 35 U.S.C. 154(b) by 661 days.

(21) Appl. No.: 13/532,192

(22) Filed: Jun. 25, 2012

(65) Prior Publication Data

US 2012/0330588 A1  Dec. 27, 2012

Related U.S. Application Data

(60) Provisional application No. 61/500,331, filed on Jun. 23, 2011.

(51) Int. Cl.
*H04Q 9/00* (2006.01)
*G01R 31/36* (2006.01)

(52) U.S. Cl.
CPC ............. *H04Q 9/00* (2013.01); *G01R 31/3689* (2013.01); *H04Q 2209/30* (2013.01); *H04Q 2209/823* (2013.01)

(58) Field of Classification Search
CPC ........................................................ H04Q 9/00
USPC ........................................................... 702/63
See application file for complete search history.

(56) References Cited

U.S. PATENT DOCUMENTS

2005/0071093 A1 * 3/2005 Stefan ............................. 702/60
2010/0114512 A1   5/2010 Cotton et al.

* cited by examiner

*Primary Examiner* — Bryan Bui
(74) *Attorney, Agent, or Firm* — Goerge R. McGuire; Bond Schoeneck & King, PLLC

(57) ABSTRACT

A battery monitoring system including an on-site battery event monitor (BEM) that sends out battery-related data to a server over a wide area network (WAN). The BEM sends out data in a broadcast (or unicast manner) to predetermined server(s) without being queried or polled. This improves network security and data security and also eliminates the need for on-site network configuration and administration.

12 Claims, 5 Drawing Sheets

BATTERY MONITORING SYSTEM

RELATED APPLICATION

The present application claims priority to U.S. provisional patent application No. 61/500,331, filed on 23 Jun. 2011; all of the foregoing patent-related document(s) are hereby incorporated by reference herein in their respective entirety(ies).

BACKGROUND OF THE INVENTION

1. Field of the Invention

The present invention relates to battery monitoring and/or control systems and, more particularly, to battery monitoring and/or control systems implemented over computer networks (especially wide area computer networks).

2. Description of the Related Art

US patent application 2010/0114512 ("Cotton") discloses a system and method for collecting and storing data associated with of battery characteristics. A user of the Cotton system receives data including alerts, failure predictions, aging items and "comprehensive battery management information." The battery management information of the Cotton system is disclosed to include the following information: (i) replacement information relating to the last time a particular battery unit was replaced; (ii) the last time that the user logged into the system and received data for the battery; (iii) the internet protocol (IP) address and domain from which the user checked the battery; and (iv) characteristics associated with the battery storage facility. The disclosed characteristics of the battery storage facility, included in the battery management information of the Cotton system, includes the ambient temperature of the battery storage facility.

Cotton further discloses that the data associated with battery sites may be transmitted over an encrypted or an unencrypted data link over. For example, the battery and battery site information of Cotton may be communicated over the Internet.

Cotton discloses that battery-related reports are generated. These battery-related reports are disclosed to include: (i) battery life prediction information; and (ii) alarm data. Cotton discloses that these reports may be generated based on a an end-user's query workstation. Cotton further discloses that battery-related reports may be pushed to an end-user based on a predetermined condition, such as a power outage, a power surge, or a change in temperature of the battery storage site.

Description Of the Related Art Section Disclaimer: To the extent that specific publications are discussed above in this Description of the Related Art Section, these discussions should not be taken as an admission that the discussed publications (for example, published patents) are prior art for patent law purposes. For example, some or all of the discussed publications may not be sufficiently early in time, may not reflect subject matter developed early enough in time and/or may not be sufficiently enabling so as to amount to prior art for patent law purposes. To the extent that specific publications are discussed above in this Description of the Related Art Section, they are all hereby incorporated by reference into this document in their respective entirety(ies).

BRIEF SUMMARY OF THE INVENTION

The present invention is directed to a battery monitoring system and to methods of battery monitoring. While there is no particular lower limit on how small these batteries could be in theory, most applications of the present invention are currently expected to relate to relatively large batteries; for example, the kind of battery sets that can serve as a substitute for utility power in the event that utility power is, or becomes, unavailable. As a further example, some large computer systems have battery backup to utility electrical power so that the computer system reliably operates in a continuous manner such that no valuable data is lost. This example helps to show the potentially large importance of battery monitoring with respect to some aspects of the present invention. Military and/or emergency response systems are other examples of applications where battery system reliability is highly critical, meaning that battery monitoring should be very highly reliable.

Some embodiments of the present invention include an on-site battery event monitor (BEM) that is structured, connected and configured to send battery data, over a communication network, to a predetermined remote server (or predetermined remote servers) without being queried by the remote server(s). The Cotton system is based on polling, which means that battery information is sent to a remote server based on queries sent from the server to the battery site. In the "no-query" BEM embodiments (also called broadcast or unicast embodiments) of the present invention, the fact that polling is not required can eliminate the need for on-site network configuration with respect to things like dns configuration, static ip configuration, port forwarding and the like. In some of these embodiments, the BEM is structured to be actually unable to receive remote queries, which increases computer network security. In other (not necessarily preferred) embodiments, the BEM may be able to receive remote queries, but can still send out battery-monitoring-related data without the need for such queries and/or polling.

In some embodiments of the present invention, the BEM includes a data collection module that is structured, programmed and/or connected to convert all analog form battery-related data into digital form. For example, current and voltage related battery-related data is preferably received from the battery string in analog form, and the data collection module of the BEM converts all of this analog data into digital data. The data collection module may perform other types of processing. These embodiments obviate the need to have separate components (other than the BEM) process the current and/or voltage related battery-related data.

In some embodiments of the present invention, the BEM includes a broadcast module that packetizes and/or encapsulates the battery-related data so that it is suitable for transmission through a computer communication network, such as the internet.

Various embodiments of the present invention may exhibit one or more of the following objects, features and/or advantages:

(i) maximize performance of battery systems;
(ii) decrease budget for operating battery system;
(iii) better manage risk of battery systems;
(iv) reduce unplanned expenses associated with battery systems;
(v) focus resources associated with battery systems;
(vi) investment in a battery monitoring system may, in some cases, be effectively recouped by heading off a single catastrophic battery system failure;
(vii) improved reliability of battery systems (optimally 100% reliability);
(viii) robust maintenance program;
(ix) around the clock assurance;
(x) skilled data interpretation of battery monitor data (by skilled workers who may be located remotely from the batteries themselves);
(xi) early problem detection;

(xii) in embodiments where the electronics needed to calculate current and/or voltage are located entirely in the BEM housing, there are fewer separate components to buy, ensure compatibility, install and/or connect; and (xiii) in embodiments where the electronics needed to calculate current and/or voltage are located entirely in the BEM housing, there is no need to resort to third party suppliers (that is suppliers other than the supplier of the BEM) to build the portion of the battery monitoring system that is located at the monitored battery site.

According to an aspect of the present invention, a BEM is provided for use in a battery monitoring system for monitoring a battery site. The battery site has a set of battery(ies) that includes at least one battery. The battery monitoring system includes a communication network and a first server sub-system. The BEM includes: a data collection module; a broadcast module; a data-collection connector hardware set; and a network connector hardware set. The data-collection connector hardware set is structured, programmed and/or connected to receive battery-related data from the battery site. The data collection module is structured, connected and/or programmed to receive the battery-related data from the data-collection connector hardware set. The broadcast module is structured, connected and/or programmed to: (i) receive the battery-related data from the data collection module, (ii) convert the battery-related data into a form and format suitable for being data communicated over a communication network, and (iii) designate the first server sub-system. The network connector hardware set is structured, programmed and/or connected to: (i) receive the battery-related data, in the form and format suitable for being data communicated over a communication network, from the broadcast module; and (ii) send the battery-related data over the communication network to the first server sub-system as designated by the broadcast module. The broadcast module and the network connector hardware set are further structured, connected and/or programmed so that the battery-related data over the communication network to the first server sub-system on a broadcast basis.

According to a further aspect of the present invention, a battery monitoring system includes: a battery site; a BEM; a communication network comprising a LAN and a WAN; a first server sub-system; and a first user sub-system. The battery site includes a set of battery(ies) that includes at least one battery, and a battery bus. The LAN is located at the battery site. The LAN, the first user sub-system and the first server sub-system are connected in data communication over the WAN. The BEM comprises a data collection module, a broadcast module, a data-collection connector hardware set and a network connector hardware set. The data-collection connector hardware set is structured, programmed and/or connected to receive battery-related data from the battery site. The data collection module is structured, connected and/or programmed to receive the battery-related data from the data-collection connector hardware set. The broadcast module is structured, connected and/or programmed to: (i) receive the battery-related data from the data collection module, (ii) convert the battery-related data into a form and format suitable for being data communicated over a communication network, and (iii) designate the first server sub-system. The network connector hardware set is structured, programmed and/or connected to: (i) receive the battery-related data, in the form and format suitable for being data communicated over a communication network, from the broadcast module; and (ii) send the battery-related data over the LAN and WAN to the first server sub-system as designated by the broadcast module. The broadcast module and the network connector hardware set are further structured, connected and/or programmed so that the battery-related data over the communication network to the first server sub-system. The first server sub-system is structured, programmed and/or connected to send the battery-related data to the first user sub-system over the WAN.

BRIEF DESCRIPTION OF THE DRAWINGS

The present invention will be more fully understood and appreciated by reading the following Detailed Description in conjunction with the accompanying drawings, in which.

DETAILED DESCRIPTION OF THE INVENTION

Figure 1:
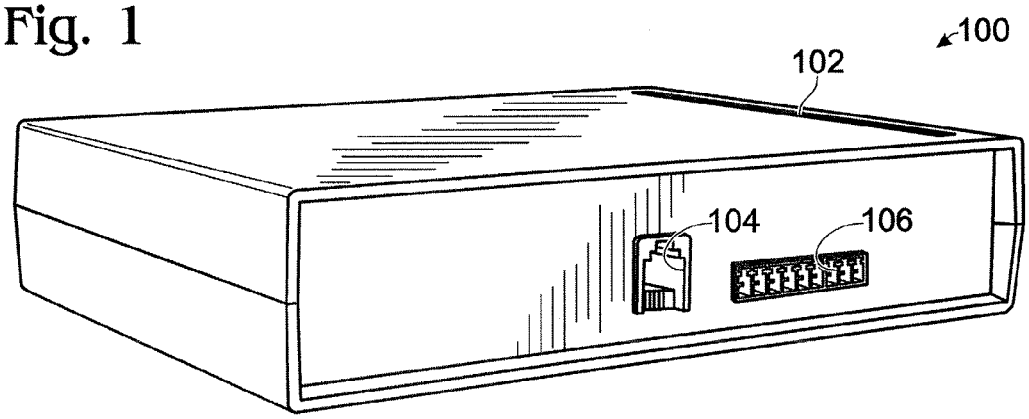
FIG. 1 is a perspective view of a first embodiment of a battery event monitor (BEM) according to the present invention.

FIG. 1 shows an embodiment battery event monitor ("BEM") 100 including housing 102; first set of socket connector(s) 104 and second set of socket connector(s) 106. In some embodiments of the present invention, the BEM may not be in the form of a separate component in a dedicated housing, as BEM 100 is. For example, in alternative embodiments, the BEM may be in the form of software pre-installed on a general purpose computer (albeit a general purpose computer with one or more connectors suitable for communicating data with the batteries of the customer). In some alternative embodiments, the BEM may take a form that includes software that can be installed on a customer's computer (this type of embodiment might further include hardware to facilitate data communication between the battery (ies) and the customer's computer on which the software has been installed.

Notwithstanding the foregoing, some embodiments may require that all software needed to run and execute the battery monitoring of the present invention is located in a single BEM housing so that the customer does not need to install any software or firmware. This can be an important advantage because customer installation of software is burdensome and tedious for the customer, and also the installation process may be subject to: (i) difficulties arising from attempted incorrect installation of the software; and/or (ii) incompatibilities between the supplied software and the customer's hardware/ software. Embodiments where all software is pre-installed into a dedicated device like BEM 100, or even a general purpose computer pre-programmed before being supplied to the customer, would avoid these potential problems. For example, when using BEM 100, installation is as simple, on the customer side, as connecting BEM 100 to the battery string(s) and thermal sensors socket through connectors 106 (battery string voltage related data and thermal data) and 104

(battery current related data). There is no software that requires installation or compilation and the customer does not need to enter battery information into BEM 100.

Figure 3:
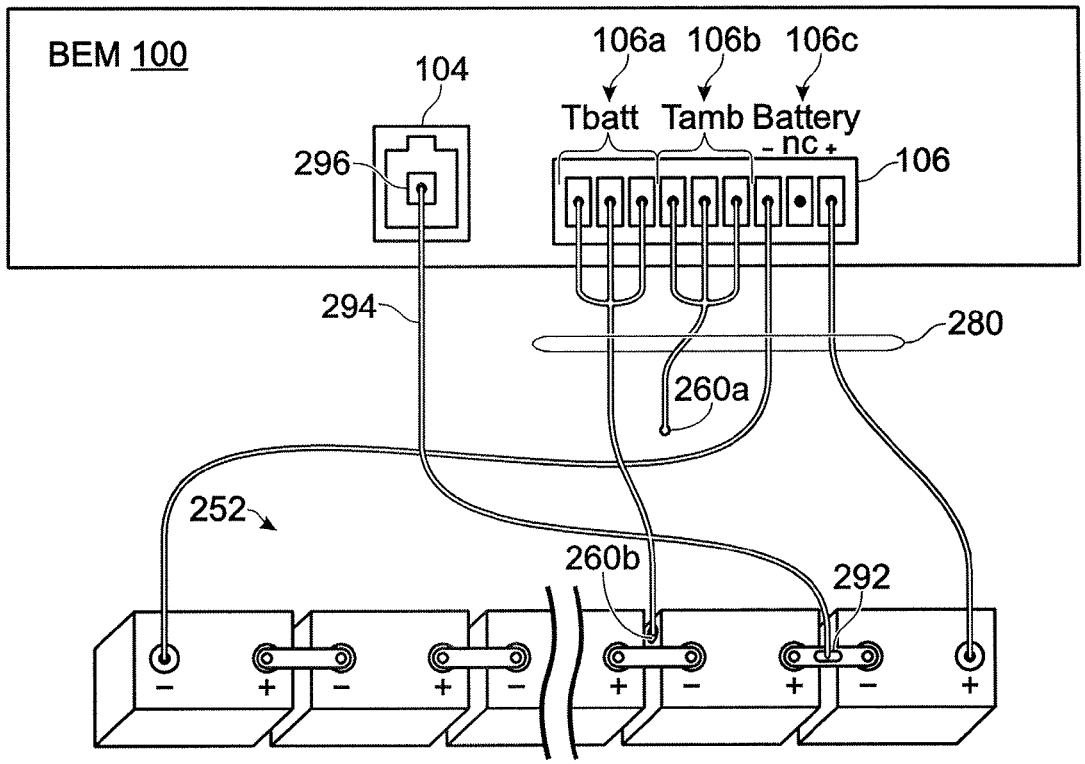
FIG. 3 is a schematic view of a portion of the first embodiment battery monitoring system.
Figure 4:
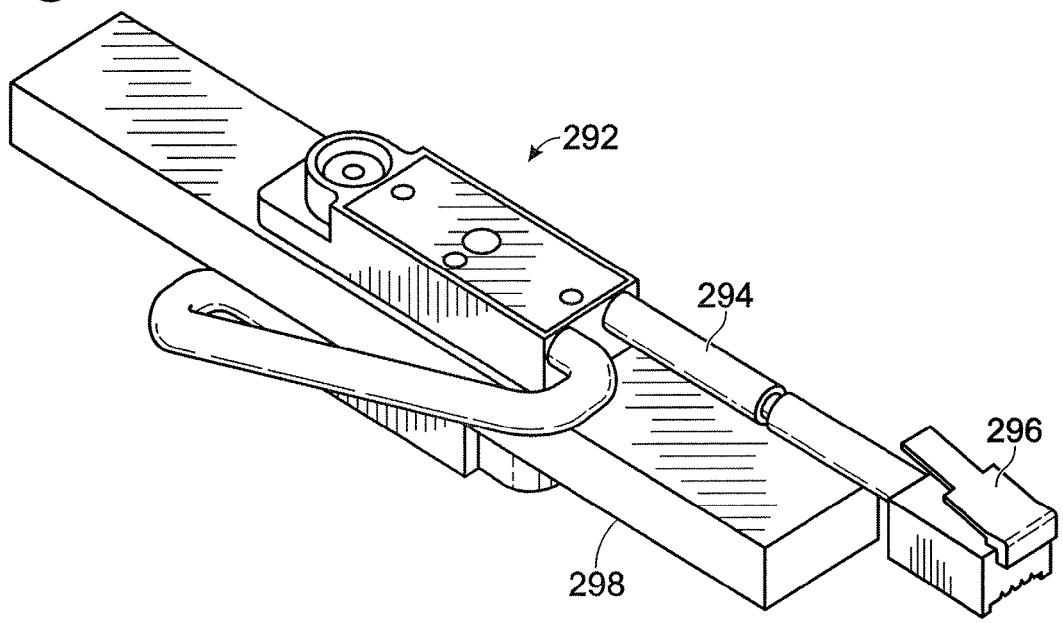
FIG. 4 is a perspective view of a portion of the first embodiment battery monitoring system.
Figure 6:
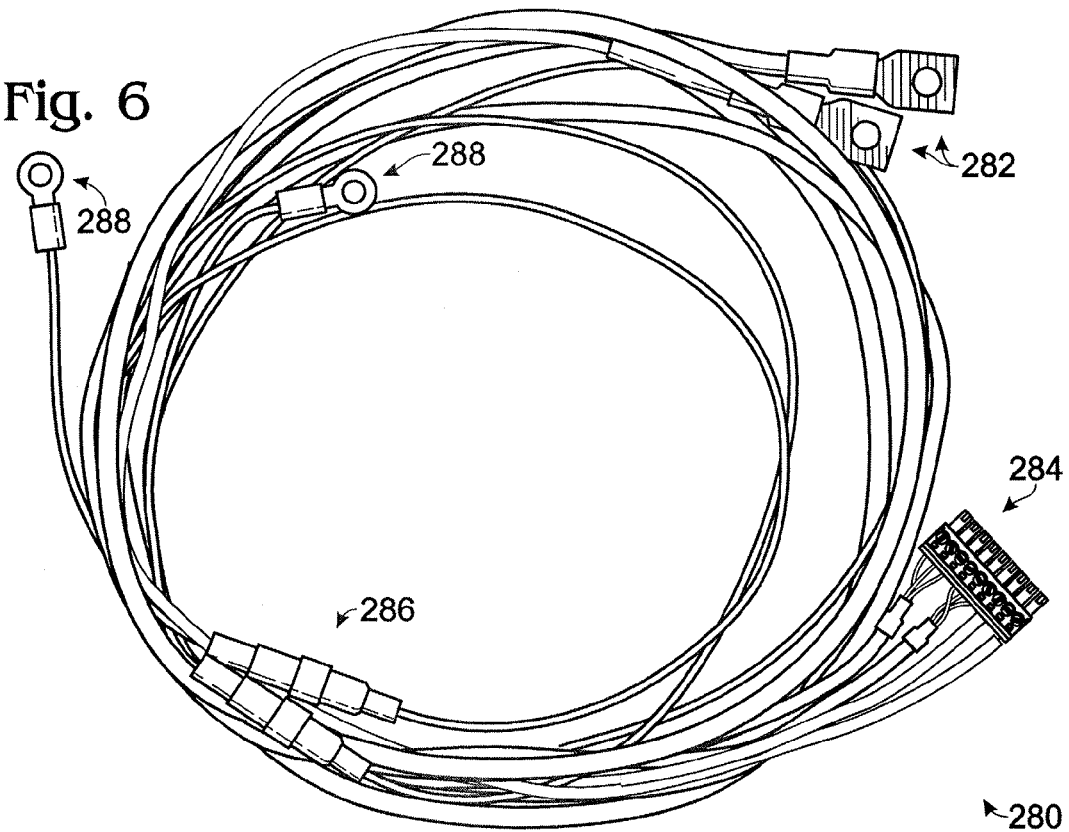
FIG. 6 is a perspective view of a battery bus (not installed) for use in the present invention.
Figure 8:
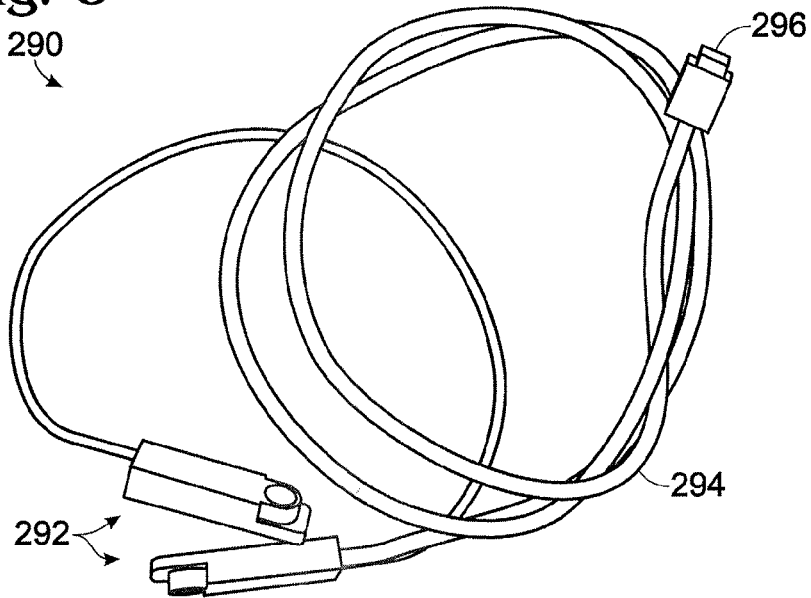
FIG. 8 is a perspective view of a battery current data communication cable for use in the present invention.

First set of socket connector(s) 104 is structured to connect BEM 100 to a current detection hardware set 290 (see FIGS. 6 and 8). As shown in FIGS. 6 and 8, the current detection hardware set includes: current probe hardware 292, cable run 294, and BEM-connector jack 296. As best shown in FIGS. 4 and 3, the current probe hardware connects transversely across a current carrier 298, which current carrier 298 is a pre-existing part of the battery string. The current probes provide current-related battery-related data in analog form to BEM 100. Current probe 292 preferably includes a Hall-effects transducer which provides current data in analog form.

Figure 7:
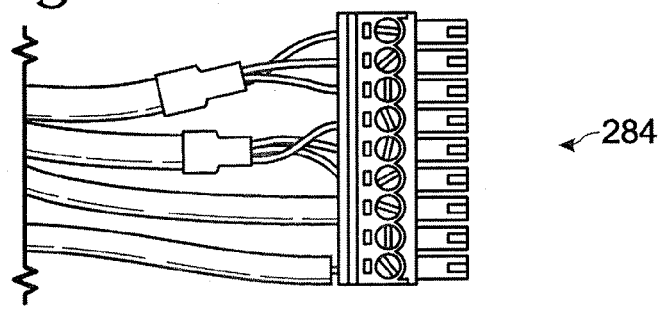
FIG. 7 is a detail view of the battery bus of FIG. 6.

Second set of socket connector(s) 106 is structured to connect BEM 100 to battery bus 280. As shown in FIGS. 3, 6 and 7, the battery bus includes: temperature sensor connectors 282; BEM-connector header 284; fuses 286; battery-voltage connector lugs 288. As shown in FIG. 3, the BEM-connector header connects to socket connector 106 of the BEM (which includes 3 ambient temperature sensor lines 106b; 3 cell-level temperature sensor lines 106a and two battery voltage lines 106c). The battery voltage connector lugs will simply take on the voltage level corresponding to the points in the battery string to which they are respectively connected. This analog voltage related data is converted to digital data by BEM 100.

Figure 5:
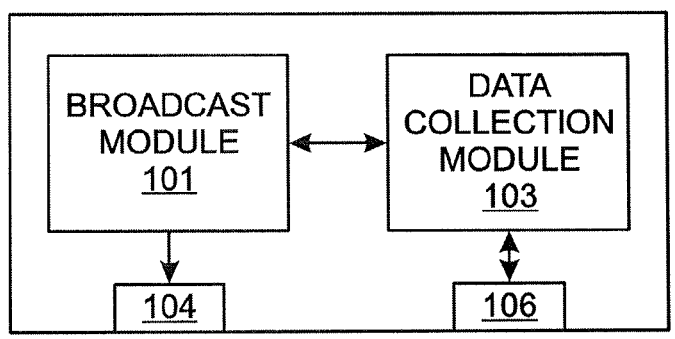
FIG. 5 is a schematic view of the first embodiment BEM.

FIG. 5 shows that BEM 100 includes broadcast module 101 and data collection module 103. The data collection module is structured, connected and/or programmed to collect battery-related data. The data collection module may or may not perform processing of the data it receives through connector 106. The data collection module does at least generally convert analog form data to digital form. The broadcast module is structured to broadcast (or unicast) battery related data received from and/or through the data collection module. The broadcast module sends this battery related data out to one, or more, predetermined servers over a communication network including the customer's LAN and a WAN (in the form of the internet). The broadcast module does not require a received query to prompt it to broadcast the data—it is programmed to send the data out without regard to queries. In fact, BEM 100 cannot even receive queries of any kind at all, which serves to enhance computer network security.

Figure 2:
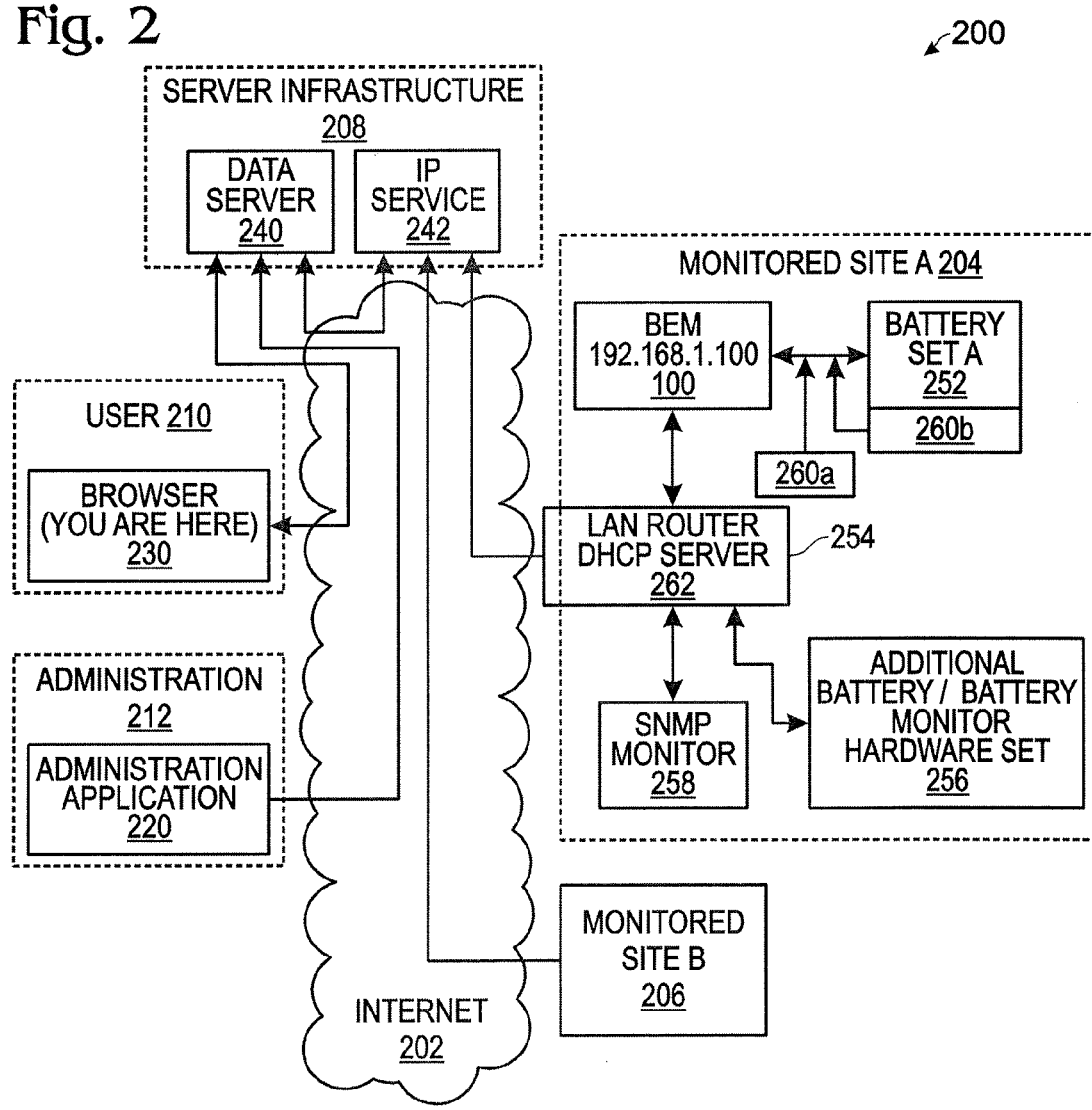
FIG. 2 is a schematic view of a first embodiment of a battery monitoring system according to the present invention.

FIG. 2 shows a battery management and/or control system 200 including: internet 202; monitored site A 204; monitored site B 206; server infrastructure sub-system 208; user sub-system 210; and administration sub-system 212. Monitored site 204 includes: BEM 100; battery string A 252; local area network (LAN) router/dynamic host configuration protocol (DHCP) server 254; additional battery/battery monitor hardware set 256; simple network management protocol (SNMP) module 258; and temperature sensors 260 (these can be analog or digital). More specifically, temperature sensor 260a detects ambient temperature and temperature sensor 260b detects cell and/or battery temperature.

Additional battery/battery monitor hardware set 256 shows that multiple BEMs 100 may be present and operational at a given monitored site. The additional battery/battery monitor hardware set would include a second BEM component (not separately shown, similar to BEM 100), a second battery string (not separately shown, similar to battery string 252) and additional wiring and temperature sensors. In embodiment 200, a dedicated BEM 100 is required for each battery string. In alternative embodiments, a single BEM may serve multiple battery strings.

Server infrastructure sub-system 208 includes data server module 240 and internet protocol (IP) service module 242. User sub-system 210 includes browser module 230. Administration sub-system 212 includes administration application 220. FIG. 2 also shows how the various components are in data communication with each other.

In operation, BEM 100 directly monitors battery A and the other batteries at monitored site A, while a similar BEM (not shown) monitors similar batteries (not shown) at monitored site B. This monitoring information is communicated with the server infrastructure sub-system. The server infrastructure sub-system communicates with users and administration. In this way, both the users (that is, people and/or software monitoring the BEM outputs) and the administration can be located remotely from the sites where the actual batteries are. This is not to say that visual and/or in-person inspection of the battery(ies) and/or their outputs is never desirable and/or required, but the remote monitoring capability provided by the wide area network communication capabilities of BEM 100 can reduce the need for this in-person inspection. In some embodiments, the router will be pre-existing equipment (hardware and/or software) that the customer has. In other embodiments, the supplier of the BEM component may supply the router. In still other embodiments, there will be no need for a router as the necessary equipment for communicating over the wide area network (WAN) may be built into BEM 100.

In some embodiments of the present invention, the party who provides (for example, sells or leases) the BEMs to the customer (that is, the party with the batteries that require monitoring) may also provide ongoing battery monitoring services to the customer. Under this business model, the user sub-system and the administration sub-system would generally be in the custody and control of personnel of the BEM supplier party. In this way, the actual people monitoring the battery(ies) remotely through system 200 may be expected to have extensive training and high capability as far as predicting and preventing battery problems based on the data communicated to them through system 200. To explain more fully, the prediction of a battery problem, preferably well in advance of a catastrophic failure, can be a matter of noticing subtle and/or esoteric patterns in the data. Furthermore, these diagnostic patterns and techniques may change over time as the chemistry and/or construction of battery(ies) changes over time. This is why it may be preferable to have a human user who monitors the BEM data be someone other than an employee of the owner of the batteries themselves. If incipient problems are caught early by expert observers, then catastrophic and costly battery failure (and associated downtime) may be avoided by various steps to correct the incipient situation. In embodiments where the BEM hardware supplier also supplies remote monitoring services, these "users" may monitor battery(ies) for a large number of different and far-flung customer (with each customer potentially having multiple and far-flung monitored sites). The monitoring may also assist replacement planning decisions.

In embodiment 200, BEM 100 communicates the following battery related data to server infrastructure 208: (i) float current measurements; (ii) battery discharge current measurements; (iii) battery recharge current measurements; (iv) string voltage (generally for more than one battery); (v) battery or cell temperature; and (vi) ambient temperature. These parameters, when properly interpreted, can provide advance warning of battery degradation and/or thermal runaway conditions.

Float voltage, along with ambient temperature, can provide warnings of probable existing or imminent failure of other equipment (herein called "ancillary equipment") that affect the battery(ies). Ancillary equipment may include rectifiers or heating, ventilation, and air conditioning (HVAC) systems.

Preferably, system 200 is designed for maintenance program enhancement by showing immediate real-time data as it happens, but this is not necessarily required of all embodiments of the present invention. Preferably, system 200 is designed for maintenance program enhancement by showing trending and predicting over long time periods, but this is not necessarily required of all embodiments of the present invention.

Preferably, system 200 is especially suited for: (i) users responsible for many monitored sites over a wide geographic area (which users/monitored sites need information between maintenance intervals, thereby allowing as-needed personnel dispatch between maintenance checks); (ii) users interested in knowing when and/or how often their batteries are called upon; (iii) users interested in knowing length and/or depth of discharges; (iv) users interested in knowing recharge times; and/or (v) users interested in knowing float conditions.

In embodiment 200, battery related data is sent "one way" to the server infrastructure, administration and user(s). In embodiment 200, there is no remote control of battery related operations. In alternative embodiments, two way communication and/or remote control may be provided. As a simple example, if the monitored battery site needs to be cooler then a user might be allowed to use adjust air cooling equipment to effect this needed cooling.

System 200 does the following: (i) provides high speed, low latency continuous real-time battery system monitoring; (ii) measures/analyzes/notifies on a battery system's voltage, current, battery temperature and ambient temperature; (iii) determines/detects battery degradation and thermal runaway; (iv) calculates capacity; (v) performs cycle counting; (vi) performs temperature compensation verification; (vi) performs building HVAC validation; (vii) continuously measures all parameters; (viii) continuously analyzes all parameters; and (ix) automatically notifies on analysis state changes.

System 200 has a three-tiered distributed architecture and an IP based internet communication platform. These three tiers are: (i) the onsite tier (that is, the BEM); (ii) the server tier; and (iii) the user/administrator tier. Browser module 230 and administrator application 220 preferably each include a desktop or web based .asp app that provides an interface to the user and to the system administrator.

System 200 uses a one way communication tunnel between the BEM and server over the internet. This provides a high degree of safety to the customer's network, which means safe communication. The BEM hardware cannot be detected from outside the customer's network and cannot be queried from outside the customer's network. It is noted that any embodiments that provide for battery system control, in addition to battery monitoring, would need to have two way communication, unless control instructions are communicated over a different data path that does not include BEM 100. Embodiment 200 does not directly perform any battery, ac utility power or HVAC control and battery control is not a primary focus of the present invention.

System 200's analysis is performed continuously based upon industry standard parameter bounds on a per battery basis.

System 200 also has the following features: (i) users can access any monitored site from any location globally; (ii) notifications on a per system/per user/per status basis; and (iii) analysis on a per system/per user/per status basis; (iv) global access to global installations; (v) high speed, low latency, continuous, real time battery monitoring; (vi) centralized monitoring facility manned by knowledgeable battery personnel; (vii) zero user network configuration; (viii) simple installation; (ix) email and/or text message notification of "battery events;" (x) complete historical data available on demand; (xi) unlimited storage capacity; (xii) data security (for example, one way communication of battery-related data, server connections using secure sockets layer (SSL) type communications); (xiii) can be powered by the bus connecting the batteries (for example 20 mA at 54 Vdc); (xiv) provides thermal runaway detection; (xv) data gathered during a discharge regime may be used for capacity calculations; (xvi) cycle counting for warranty requirements; (xvii) temperature compensation verification; and (xviii) building HVAC validation.

Some exemplary technical specifications will be set forth in this paragraph, but these only represent an example of the specifications that a system according to the present invention might have and should not be considered as required except to the extent that the parameter is recited in a claim. Battery voltage: (i) range 18-60 Vdc; (ii) resolution 0.1 Vdc; and (iii) accuracy 0.1% (+/−0.1 Vdc). Float Current: (i) range 0.1 to 10 Adc; (ii) resolution 0.1 Adc; and (iii) accuracy 1.5% (+/−0.15 Adc). Load/recharge current: (i) range 10 to 360 Adc; (ii) 0.1 Adc; and (iii) accuracy 1% (+/−0.4 Adc). Battery temperature: (i) range −40 to 125 degrees centigrade; (ii) resolution 0.1 degree centigrade; and (iii) accuracy 0.5%. Ambient temperature: (i) range −40 to 125 degrees centigrade; (ii) resolution 0.1 degrees centigrade; and (iii) accuracy 0.5%. Total system latency: less than 10 seconds. Mechanical specifications: (i) size 5.25 by 7.1 by 1.5 inches; (ii) weight 10.5 ounces. System notifications: (i) monitor disabled; (ii) monitor offline; (iii) monitor online; (iv) floating; (v) recharging; (vi) discharging; (vii) voltage bounds; (ix) temperature bounds; (x) temperature differential; (xi) high float; (xii) thermal runaway; and (xiii) "at cutoff" notification.

Exemplary monitored site specifications will be set forth in this paragraph, but these only represent an example of the specifications that a system according to the present invention might have and should not be considered as required except to the extent that a potential site requirement is recited in a claim. One potential site requirement is internet connectivity, for example, DHCP enabled, wired cat5 and/or wired Ethernet connection. However, this requirement would not apply in any embodiments of the present invention that run on private wide area networks (for example, dedicated military WANs). Another potential site requirement is a battery bus having a voltage range between 18 Vdc and 60 Vdc. Other ranges are possible, but the BEM must be designed to handle whatever voltage range is specified in the relevant specifications for a given site. In some embodiments, some or all of the data communication connections to the BEM may alternatively be wireless, although it should be understood that wireless connections may not be preferred to the extent they are less reliable than a wired connection.

Preferably, the supplier of the BEM also supplies the temperature sensors 260a,b (see FIG. 2) in order to ensure data communication compatibility between the BEM and the temperature sensors. While temperature feedback data is generally highly important with respect to analyzing the performance of battery(ies) according to currently-popular battery designs, not all embodiments of the present invention necessarily include temperature detection. Also, other battery-related data might be detected by additional external sensors that report back to BEM 100. For example, a battery that is subject to corrosion may utilize a battery monitoring system according to the present invention that includes a corrosion detector and corrosion-related data.

Figure 9:
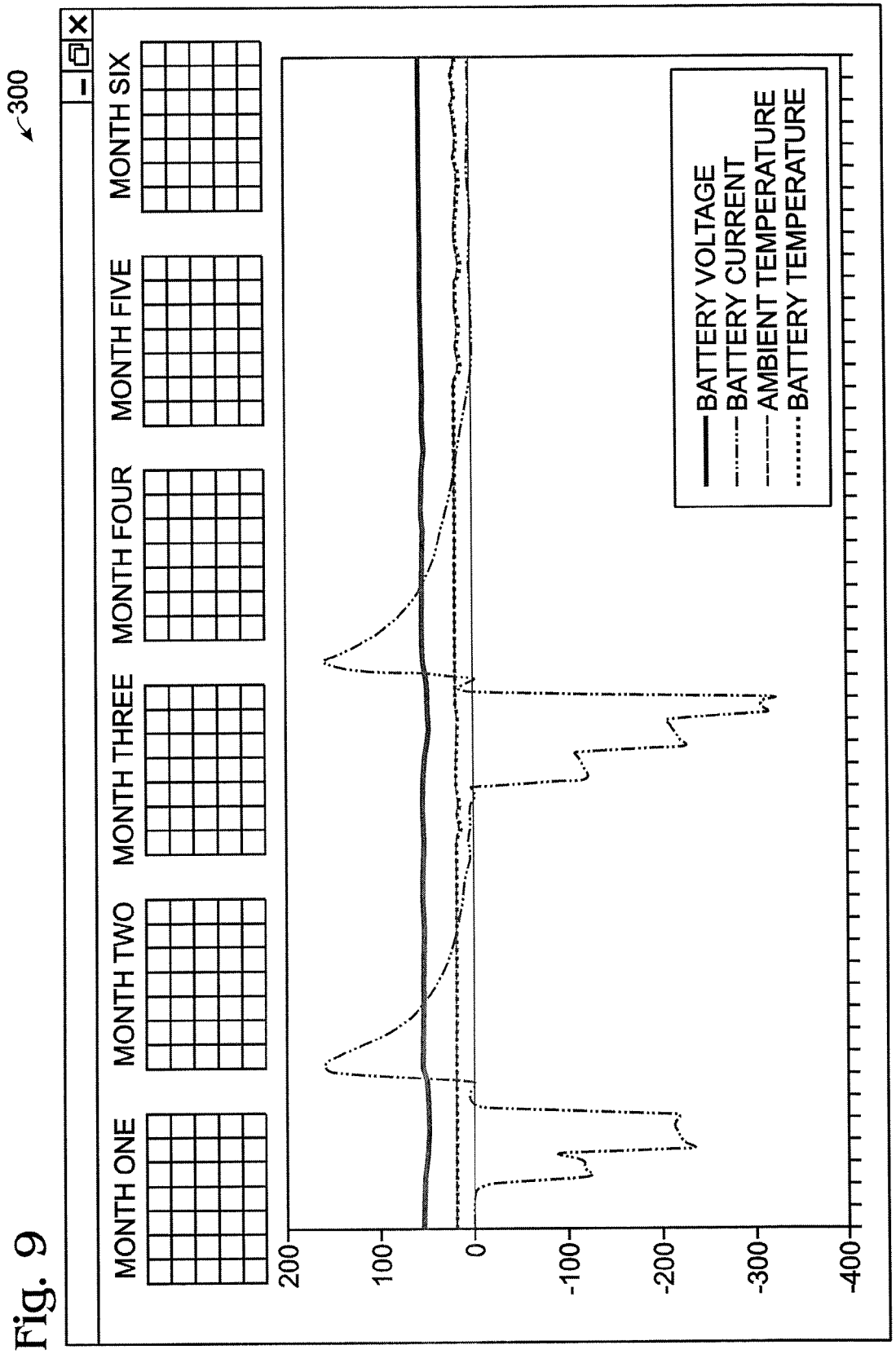
FIG. 9 is a screen shot generated by the first embodiment battery monitoring system.

FIG. 9 shows screenshot 300, which is an exemplary display that can be viewed by user 210 when monitoring batteries according to the present invention.

Figure 10:
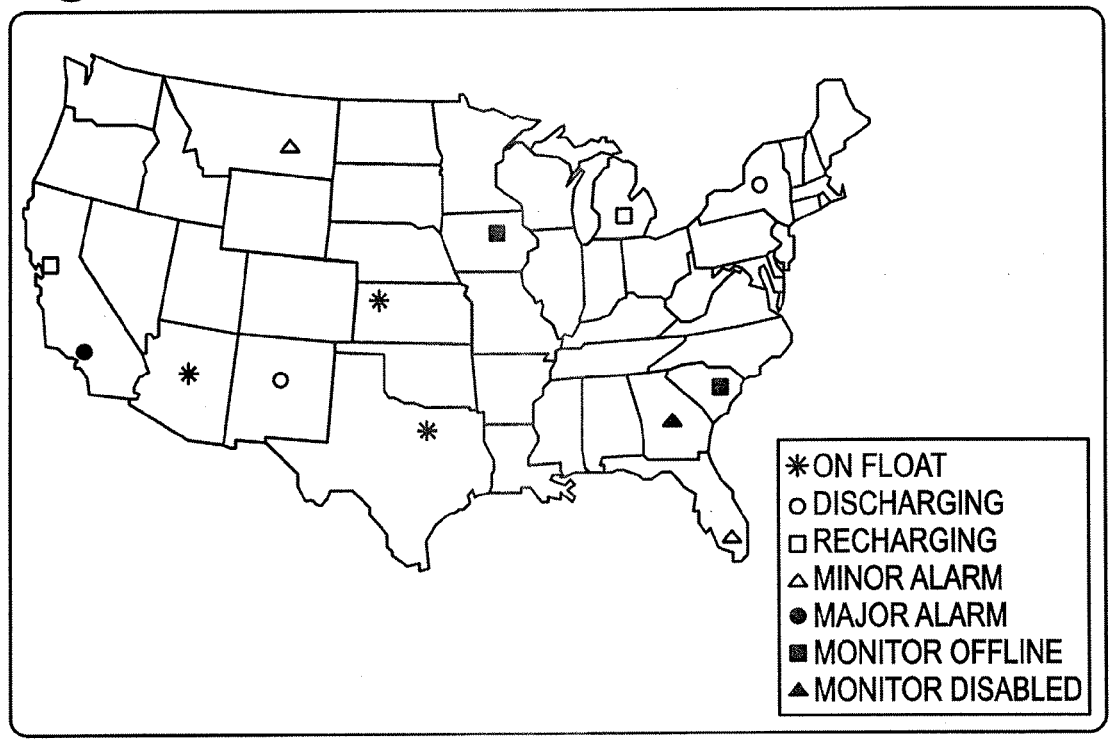
FIG. 10 is another screen shot generated by the first embodiment battery monitoring system.

FIG. 10 shows screen shot 400, which is an exemplary display that can be viewed by a user when monitoring multiple battery sites across (in this example) the United States.

At least some embodiments of the present invention are designed as maintenance program enhancement and store immediate realtime data as it happens, with low latency. This can provide historical trending for sophisticated predictive analysis.

At least some highly preferred embodiments of the present invention have one or more of the following features: (i) non-intrusive monitoring hardware; (ii) a battery monitoring system that can be installed without taking the subject battery(ies) offline; (iii) a battery monitoring system that requires no customer configuration; and/or (iv) a battery monitoring system that requires no customer administration.

An additional feature of system 200 is that it is based on universal time and is therefore time zone compliant. Users can see battery monitoring data based on UTC, local or site time zones. This can be especially helpful for responsible parties who monitor multiple sites located in multiple time zones.

Some embodiments of the present invention monitor additional battery-related parameters. These additional parameters may include: (i) battery charger (for example, a rectifier) parameters; (ii) ac input parameters; (iii) dc load current; (iv) rectifier dry contact alarm outputs. When an embodiment monitors these kinds of additional parameters it may be considered as a "dc plant monitor."

DEFINITIONS

Any and all published documents mentioned herein shall be considered to be incorporated by reference, in their respective entireties. The following definitions are provided for claim construction purposes:

Present invention: means "at least some embodiments of the present invention," and the use of the term "present invention" in connection with some feature described herein shall not mean that all claimed embodiments (see DEFINITIONS section) include the referenced feature(s).

Embodiment: a machine, manufacture, system, method, process and/or composition that may (not must) be within the scope of a present or future patent claim of this patent document; often, an "embodiment" will be within the scope of at least some of the originally filed claims and will also end up being within the scope of at least some of the claims as issued (after the claims have been developed through the process of patent prosecution), but this is not necessarily always the case; for example, an "embodiment" might be covered by neither the originally filed claims, nor the claims as issued, despite the description of the "embodiment" as an "embodiment."

First, second, third, etc. ("ordinals"): Unless otherwise noted, ordinals only serve to distinguish or identify (e.g., various members of a group); the mere use of ordinals shall not be taken to necessarily imply order (for example, time order, space order).

Electrically Connected: means either directly electrically connected, or indirectly electrically connected, such that intervening elements are present; in an indirect electrical connection, the intervening elements may include inductors and/or transformers.

Data communication: any sort of data communication scheme now known or to be developed in the future, including wireless communication, wired communication and communication routes that have wireless and wired portions; data communication is not necessarily limited to: (i) direct data communication; (ii) indirect data communication; and/or (iii) data communication where the format, packetization status, medium, encryption status and/or protocol remains constant over the entire course of the data communication.

Receive/provide/send/input/output: unless otherwise explicitly specified, these words should not be taken to imply: (i) any particular degree of directness with respect to the relationship between their objects and subjects; and/or (ii) absence of intermediate components, actions and/or things interposed between their objects and subjects.

Module/Sub-Module: any set of hardware, firmware and/or software that operatively works to do some kind of function, without regard to whether the module is: (i) in a single local proximity; (ii) distributed over a wide area; (ii) in a single proximity within a larger piece of software code; (iii) located within a single piece of software code; (iv) located in a single storage device, memory or medium; (v) mechanically connected; (vi) electrically connected; and/or (vii) connected in data communication.

battery-related data: includes parameters operatively related to battery performance (for example, battery temperature, ambient temperature), or any other sort of signal from which battery-related parameters can be calculated or derived (for example, a dc "signal" from a battery can be used to derive and/or calculate battery voltage and/or current and would therefore be considered as battery-related data).

broadcast basis: data is sent without the need for any query and/or polling, such that the data is not sent in response to a query and no query is required; a broadcast basis includes unicast systems where data is sent to only one recipient server.

Unless otherwise explicitly provided in the claim language, steps in method or process claims need only be performed that they happen to be set forth in the claim only to the extent that impossibility or extreme feasibility problems dictate that the recited step order be used. This broad interpretation with respect to step order is to be used regardless of whether a particular alternative time ordering (that is, time ordering of the claimed steps that is different than the order of recitation in the claim) is particularly mentioned or discussed in this document. Any step order discussed in the above specification, and/or based upon order of step recitation in a claim, shall be considered as required by a method claim only if: (i) the step order is explicitly set forth in the words of the method claim itself; and/or (ii) it would be substantially impossible to perform the method in a different order. Unless otherwise specified in the method claims themselves, steps may be performed simultaneously or in any sort of temporally overlapping manner. Also, when any sort of time ordering is explicitly set forth in a method claim, the time ordering claim language shall not be taken as an implicit limitation on whether claimed steps are immediately consecutive in time, or as an implicit limitation against intervening steps.

What is claimed is:

1. A BEM for use in a battery monitoring system for monitoring a battery site having a set of battery(ies) that includes at least one battery, the battery monitoring system including a communication network and a first server sub-system, the BEM comprising:
   a data collection module;
   a broadcast module;
   a data-collection connector hardware set; and a network connector hardware set;
wherein:
the data-collection connector hardware set is connected to said battery site so as to receive battery-related data therefrom;
the data collection module is connected to said data collection connector hardware set so as to receive the battery-related data therefrom;
the broadcast module is connected to the data collection module to: (i) receive the battery-related data, (ii) convert the battery-related data into a form and format suitable for being data communicated over a communication network, and (iii) designate the first server sub-system;
the network connector hardware set is connected to the broadcast module to: (i) receive the battery-related data, in the form and format suitable for being data communicated over a communication network; and (ii) send the battery-related data over the communication network to the first server sub-system as designated by the broadcast module; and
the broadcast module and the network connector hardware set are further in communication so that the battery-related data over the communication network to the first server sub-system on a broadcast basis, and so that the BEM is not capable of receiving any substantive data communications from the communication network.

2. The BEM of claim 1 further comprising a housing, wherein the data collection module, the broadcast module, the data-collection hardware set and the network connector hardware set are all located on the housing.

3. The BEM of claim 1 wherein:
the data collection module set receives at least some of the battery-related data in analog form; and
the data collection module converts all analog form battery-related data into corresponding digital form battery related data before sending the battery related data to the broadcast module.

4. The BEM of claim 1 wherein the battery-related data sent from the data collection module to the broadcast module includes the following types of battery-related data: (i) battery temperature, (ii) ambient temperature, (iii) float current, (iv) battery discharge current, (v) battery recharge current and (vi) battery voltage data.

5. The BEM of claim 4 wherein the battery voltage data is battery string voltage data.

6. The BEM of claim 1 wherein:
the communication network includes the internet; and
the broadcast module is further structured to put the battery-related data into a form and format for being communicated over the internet.

7. The BEM of claim 1 wherein the network connection hardware set and the broadcast module are structured so that the BEM is not capable of receiving any substantive data communications from the communication network.

8. The BEM of claim 1 wherein the battery site further includes a battery bus and the data collection module is structured to form a wired connection with the battery bus.

9. The BEM of claim 1 wherein the communication network includes a LAN at the battery site and the network connector hardware set is further structured to form a data communication connection with the LAN.

10. The BEM of claim 9 wherein the data communication between the network connector hardware set and the LAN is a wired connection.

11. The BEM of claim 1 wherein the network connection hardware set and the broadcast module are structured so that the battery-related data is sent to the designated first server sub-system on an at least substantially continuous broadcast basis.

12. The BEM of claim 1 further comprising a housing, wherein the data collection module, the broadcast module, the data-collection hardware set and the network connector hardware set are all located in the housing.

* * * * *